United States Patent
Matsui et al.

(10) Patent No.: US 7,569,765 B2
(45) Date of Patent: Aug. 4, 2009

(54) ELECTRODE, PHOTOELECTRIC CONVERSION ELEMENT, AND DYE-SENSITIZED SOLAR CELL

(75) Inventors: Hiroshi Matsui, Tokyo (JP); Nobuo Tanabe, Tokyo (JP)

(73) Assignee: Fujikura Ltd., Tokyo (JP)

( * ) Notice: Subject to any disclaimer, the term of this patent is extended or adjusted under 35 U.S.C. 154(b) by 432 days.

(21) Appl. No.: 11/281,411

(22) Filed: Nov. 18, 2005

(65) Prior Publication Data
US 2006/0107997 A1    May 25, 2006

(30) Foreign Application Priority Data

| Nov. 22, 2004 | (JP) | ............................. 2004-337530 |
| Nov. 22, 2004 | (JP) | ............................. 2004-337531 |

(51) Int. Cl.
*H01L 31/00* (2006.01)
*B23H 3/04* (2006.01)

(52) U.S. Cl. ................. 136/263; 204/290.15; 204/294; 204/292

(58) Field of Classification Search ................. 136/263; 204/290.15, 294, 292
See application file for complete search history.

(56) References Cited

U.S. PATENT DOCUMENTS

| 4,927,721 | A |  | 5/1990 | Gratzel et al. |
| 5,665,501 | A | * | 9/1997 | Derks et al. ................ 430/58.4 |

| 2004/0166235 | A1 | 8/2004 | Fujii et al. |

FOREIGN PATENT DOCUMENTS

| EP | 1 207 572 A1 | 5/2002 |
| JP | 2664194 B2 | 6/1997 |
| JP | 2000-231942 A | 8/2000 |
| JP | 2000-285977 A | 10/2000 |
| JP | 2002-298936 A | 10/2002 |
| JP | 2003-151364 A | 5/2003 |
| JP | 2003-347193 A | 12/2003 |
| JP | 2004-241228 A | 8/2004 |

OTHER PUBLICATIONS

Michael Graetzel, Letters to Nature, United Kingdom, 1991, vol. 737, p. 353.

* cited by examiner

*Primary Examiner*—Alex Noguerola
(74) *Attorney, Agent, or Firm*—Sughrue Mion, PLLC

(57) ABSTRACT

An electrode according to the present invention includes a substrate, and a conductive layer containing carbon particles or platinum particles and a conductive binder for binding the carbon particles or platinum particles formed above the substrate. By binding the carbon particles or the platinum particles with the conductive binder, it is possible to form an electrode with a porous structure where spaces that communicate with a surface of the conductive layer are defined between the corresponding carbon particles or platinum particles, thereby increasing the effective area (surface area) of the electrode. The photoelectric conversion elements and the dye-sensitized photovoltaic or solar cells according to the present invention can be manufactured at a low cost and have an increased effective area, making it possible to obtain excellent photoelectric conversion efficiency.

21 Claims, 3 Drawing Sheets

ELECTRODE, PHOTOELECTRIC CONVERSION ELEMENT, AND DYE-SENSITIZED SOLAR CELL

BACKGROUND OF THE INVENTION

1. Field of the Invention

The present invention relates to an electrode, a photoelectric conversion element, and a dye-sensitized solar cell.

Priority is claimed on Japanese Patent Application Nos. 2004-337530 and 2004-337531, filed Nov. 22, 2004, the contents of which are incorporated herein by reference.

2. Description of the Related Art

Dye-sensitized solar cells that have been developed by Michael Graetzel in Switzerland are attracting attention as new types of solar cells that enable a high conversion efficiency and are low in cost (see, for example, Japanese Patent No. 2664194; and Michael Graetzel, Nature, United Kingdom, 1991, vol. 737, p. 353).

Generally, in this type of dye-sensitized solar cell, a working electrode is constructed by forming a porous film with oxide semiconductive fine particles (such as nanoparticles of titanium dioxide or the like) on a transparent conductive substrate, and then causing a sensitizing dye to be provided to this porous film. This working electrode is used with a counter electrode where the working electrode faces the counter electrode, and the space between the two electrodes is filled with an electrolyte solution that contains a redox pair (such as $I_2/I_3^-$).

Such a dye-sensitized solar cell functions as a photoelectric conversion element that converts light energy into electricity when oxide semiconductive fine particles are sensitized by a sensitizing dye that absorbs incident light, such as sun light, thereby generating an electromotive force between the working electrode and the counter electrode.

As a material for the counter electrode, materials that promote the oxidation-reduction reaction of the redox couple on the surface of the electrode are desirable, and platinum is preferred. For dye-sensitized solar cells, a conductive glass, which has a conductive layer, such as a platinum layer, formed on the surface of the glass, has been widely used as a counter electrode. Methods for forming the platinum layer include vacuum film formation methods, such as sputter methods or evaporation methods, and wet film formation methods in which after applying a solution containing platinum, such as chloroplatinate solution, on the surface of the substrate, the platinum is freed by subjecting it to heat treatment (e.g., 200° C. or higher).

Conventional electrodes are costly since expensive platinum is used. Furthermore, the vacuum film formation methods suffer from shortcomings of low productivity, high facility cost, and the like. As for the wet film formation methods, there is difficulty in applying them to plastic substrates since heat treatment is required. In addition, the counter electrode of conventional dye-sensitized solar cells has a shortcoming in that it is difficult to increase the effective area of the surface of the electrode that contributes to reaction, as compared to a working electrode having an oxide semiconductive porous film.

When platinum is used for electrodes, electrodes formed by the vacuum film formation methods suffer from low productivity and high facility cost, as described previously. Furthermore, another shortcoming is that it is difficult to obtain a platinum layer having a large effective area as compared to a porous film of a working electrode that is disposed on the opposite side. The wet film formation methods have difficulty in being applied to plastic substrates since heat treatment is required, as described above.

SUMMARY OF THE INVENTION

The present invention was conceived in light of the above-described circumstances, and an object thereof is to provide an electrode and a photoelectric conversion element that can be manufactured at low cost and have an increased effective area.

In order to solve the above-described problems, the present invention provides an electrode including a substrate, and a conductive layer containing carbon particles and a conductive binder for binding the carbon particles formed above the substrate, in which numerous spaces extending from a surface of the conductive layer are defined in the conductive layer.

In the electrode of the present invention, the carbon particles preferably contain nanoparticle-like carbon particles as a main component.

In the electrode of the present invention, the conductive binder preferably contains a conductive polymer as a main component.

Examples of the conductive polymer include poly (3,4-ethylene dioxythiophene) and derivatives thereof.

Furthermore, the present invention provides a photoelectric conversion element, including: an electrode including a substrate, and a conductive layer containing carbon particles and a conductive binder for binding the carbon particles formed above the substrate, in which spaces that communicate with a surface of the conductive layer are defined between the carbon particles.

Furthermore, the present invention provides a dye-sensitized photovoltaic cell, including: an electrode including a substrate, and a conductive layer containing carbon particles and a conductive binder for binding the carbon particles formed above the substrate, in which spaces that communicate with a surface of the conductive layer are defined between the carbon particles.

In order to solve the above-described problems, the present invention provides an electrode including: a substrate, and a conductive layer containing platinum particles and a conductive binder for binding the platinum particles formed above the substrate, in which spaces that communicate with a surface of the conductive layer are defined between the platinum particles.

In the electrode of the present invention, the platinum particles preferably contain nanoparticle-like platinum particles as a main component.

Furthermore, the present invention provides a photoelectric conversion element, including: an electrode including a substrate, and a conductive layer containing platinum particles and a conductive binder for binding the platinum particles formed above the substrate, in which spaces that communicate with a surface of the conductive layer are defined between the platinum particles.

Furthermore, the present invention provides a dye-sensitized photovoltaic cell, including: an electrode including a substrate, and a conductive layer containing platinum particles and a conductive binder for binding the platinum particles formed above the substrate, in which spaces that communicate with a surface of the conductive layer are defined between the platinum particles.

According to the electrode of the present invention, it is possible to manufacture an electrode exhibiting stable properties with simplified steps at low cost. Furthermore, by binding the carbon particles with the conductive binder, it is possible to form an electrode with a porous structure having spaces on the surface thereof, thereby increasing the effective area (surface area) of the electrode. Furthermore, it is possible to form the conductive layer without requiring heat treatment at a high temperature. Thus, even when a base material with low heat resistance, such as one made from plastic, is used for the substrate, it is possible to prevent problems, such as degradation of the base material. Furthermore, by binding the platinum particles using the conductive binder, it is possible to form an electrode with a porous structure having spaces on the surface thereof, thereby increasing the effective area (surface area) of the electrode.

According to the photoelectric conversion element of the present invention, since the effective area (surface area) of the surface of the electrode is increased, it is possible to obtain excellent photoelectric conversion efficiency.

According to the dye-sensitized solar cell of the present invention, since incident light is sensitized by the sensitizing dye, it is possible to easily convert the light energy into electricity. In addition, since the effective area (surface area) of the electrode itself is increased, it is possible to obtain excellent photoelectric conversion efficiency.

DETAILED DESCRIPTION OF THE INVENTION

First Exemplary Embodiment

Hereinafter, the present invention will be described based on a first exemplary embodiment thereof.

Figure 1A:
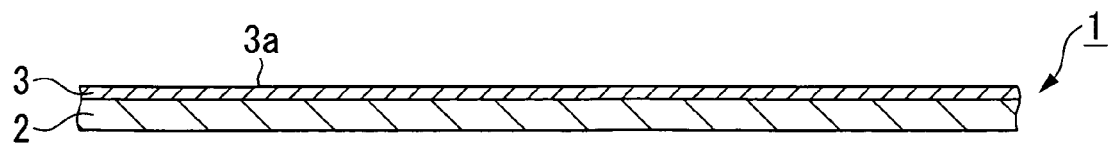
FIG. 1A is a cross-sectional view illustrating one example of an electrode according to a first exemplary embodiment of the present invention.

FIG. 1A is a cross-sectional view illustrating one example of an electrode according to a first exemplary embodiment of the present invention. An electrode (also referred to as an electrode substrate) 1 includes, for example, a substrate 2 and a conductive layer 3 that contains carbon particles and a conductive binder for binding the carbon particles provided on the substrate 2.

Examples of the substrate 2 include, but are not particularly limited to, a sheet or plate made of carbon, a glass, a plastic, a metal, a ceramic, or the like.

Glasses that may be used as the substrate 2 include, for example, borosilicate glass, quartz glass, soda glass, phosphate glass, and the like. Plastics that may be used as the substrate 2 include, for example, polyethylene terephthalate (PET), polyethylene naphthalate (PEN), polybutylene terephthalate (PBT), a polyimide, and the like. Metals that may be used as the substrate 2 include, for example, titanium, nickel, and the like.

The substrate 2 may be provided with a second conductive layer (not shown) made of a conductive metal oxide, such astin-doped indium oxide (ITO), fluorine-doped tin oxide (FTO), or FTO/ITO, or a metal formed on the surface above which the conductive layer 3 is to be provided. The material constituting the substrate and the second conductive layer is an exemplary material that is resistant to an electrolyte when in contact with the electrolyte. In the case in which an electrolyte containing iodine is used, copper and silver are not suitable, for example, since they are attacked by iodine and easily dissolve into the electrolyte.

The conductive layer 3 contains carbon particles and a conductive binder for binding the carbon particles, and spaces which communicate with a surface 3a of the conductive layer 3 are defined between the carbon particles. In other words, numerous spaces extending from a surface of the conductive layer 3 are defined in the conductive layer 3, stated differently, numerous spaces extending from a surface of the conductive layer 3 in the direction of the depth are defined between the carbon particles, and the numerous spaces define paths through which an electrolyte infiltrates.

As the carbon particles of the present invention, exemplary carbon particles are, but are not particularly limited to, nanoparticle-like ones from the viewpoint of film forming properties and surface area, and carbon particles having good conductivity are exemplary. As used herein, the term "nanoparticle-like" particles of the present invention means that the particles have a diameter in either a major or a minor axis of 1000 nm or less. Any carbon nanotubes, carbon fibers, carbon nanohorns, or the like, with a length in the longitudinal direction of more than 1000 nm can be regarded as nanoparticle-like particles of the present invention provided that the minor axis diameter thereof is 1000 nm or less.

Specific examples of nanoparticle-like carbon particles include particles, such as carbon nanotubes, carbon fibers, carbon nanohorns, carbon black, fullerenes, and the like. These materials may be prepared using well-known methods, or commercially available products may be used.

Examples of carbon nanotube include single-wall carbon nanotubes (SWCNT) having a single layer of a graphene sheet and multi-wall carbon nanotubes (MWCNT) having multiple layers (two or more layers) of graphene sheets, which can be suitably used for the present invention.

As carbon black, a ketjen black may be used.

As fullerenes, $C_{60}$ and $C_{70}$ fullerenes may be used.

In the conductive layer 3 of the electrode 1 of the present invention, carbon particles are bound by a conductive binder in order to form a film of the carbon particles above the substrate 2. The conductive binder is preferably one that requires no high temperature treatment and is easily applied to form a film, and a conductive polymer is preferred from the viewpoint of these properties. Examples of conductive polymers include, for example, polythiophenes, polyanilines, polypyrroles, and derivatives of these. A single conductive polymer may be used alone, or a combination of several conductive polymers may be used as a conductive binder.

As polythiophenes and derivatives thereof, a thiophene having unsubstituted hydrogen atoms on the thiophene ring, or thiophenes having, for example, one or more of substituent alkyl groups, halogen atoms, alkoxy groups, cyano groups or the like, may be used. Poly (3-alkylthiophene), poly (3,4-dialkyl thiophene), and poly (3,4-alkylene dioxythiophene), such as poly (3,4-ethylene dioxythiophene) (PEDOT), are exemplary.

As polypyrroles and derivatives thereof, polypyrroles with unsubstituted hydrogen atoms on the pyrrole ring, or polypyrroles having, for example, one or more of substituent alkyl groups, halogen atoms, alkoxy groups, cyano groups or the like may be used. Poly (3-alkyl pyrrole), poly (3,4-dialkyl pyrrole), and poly (3,4-alkylene dioxypyrrole), or the like are exemplary.

As polyanilines and derivatives thereof, polyanilines, poly (N-alkyl aniline), poly (arylamine), poly (phenylenediamine), and poly (aminopyrene), or the like are exemplary.

When the conductive layer 3 in which the carbon particles are bound by the conductive binder is formed above the substrate 2, spaces are formed in which no conductive binder is present between carbon particles. In this case, the spaces are cavities that communicate with the surface 3a of the conductive layer 3, and the spaces define paths through which an electrolyte (an electrolytic solution or the like) infiltrates. Thus, in the electrode of this example, the electrolyte infiltrates inside the spaces, and the entire inner surfaces of the spaces can function as an effective area that contributes to charge transfer, reaction, and the like.

Especially, carbon nanoparticles having a large apparent volume per weight are exemplary as the spaces are formed effectively if these are used.

In addition, since a film of the carbon particles are formed using the conductive binder, it is possible to form the conductive layer 3 without requiring heat treatment at a high temperature, allowing formation of the film on a base material, such as one made of plastic, with low heat resistance.

When carbon nanoparticles that have a large apparent volume per weight are used, a relatively large amount of binder is required in order to improve the film formation properties and the film strength. For this reason, when an insulating resin, such as polyester, polyurethane, polyvinylidene fluoride (PVdF), polyvinylidene fluoride-hexafluoropropylene copolymer (PVdF-HFP), or the like is used as a binder, the binder inhibits the particles from coming into contact with each other, which may reduce the conductivity of the electrode 1. The amount to be added and the mixed state of the binder may be difficult to control. In contrast, the use of a binder that exhibits conductivity is advantageous in that decrease in the conductivity due to presence of the binder between particles is prevented and an increase in the internal resistance is suppressed. In addition, constraints in terms of the composition and the mixing method of the conductive layer 3 are few.

The compounding ratio of the carbon particles to the conductive binder is appropriately selected according to types of carbon particles and conductive binder used. If too many carbon particles are present with respect to the amount of the conductive binder, the carbon particles may not be bound and a film may not be formed. Thus, the conductive binder is added at a compounding ratio such that the carbon particles are favorably bound to each other. If the amount of the carbon particles is too small with respect to the amount of the conductive binder, the carbon particles may be buried in the conductive binder and no spaces may be formed. Thus, the conductive binder is added at a compounding ratio such that spaces are formed.

The compounding ratio of the carbon particles to the conductive binder is not particularly limited, but the value obtained by dividing the mass of the carbon particles by the mass of the conductive binder (i.e., the mass ratio of carbon/binder) is, for example, within a range from 0.5 to 5, or within a range from 1 to 2.

The method for forming the electrode 1 of the present invention is not particularly limited, but the conductive layer 3 may be formed by dispersing or dissolving the carbon particles and the conductive binder into a solvent, applying the resulting mixture onto the substrate 2, and drying it, for example. The method for applying the mixture is not particularly limited, and various coating methods may be applicable, such as the doctor blade method, the spin coating method, the dipping method, the printing method, and the like.

Examples of the solvent include, but not particularly limited to, tetrahydrofuran, ethyl methyl ketone, dimethylformamide, acetonitrile, methoxy acetonitrile, propionitrile, propylene carbonate, a diethyl carbonate, methanol, γ-butyrolactone, and N-methylpyrrolidone.

It is desired that the carbon particles and the conductive binder be dispersed or dissolved in the solvent as evenly as possible, and the selection of the solvent is preferably made by taking the dispersibility and the solubility of the carbon particles and the conductive binder into consideration. It is desirable that the conductive binder have sufficient solubility or dispersibility with respect to the solvent.

According to the electrode of this example, an electrode having stable properties can be readily manufactured without using platinum. Furthermore, by binding the carbon particles with the conductive binder, it is possible to form the conductive layer 3 with a porous structure having spaces on the surface 3a thereof, thereby increasing the effective area (surface area) of the electrode 1. Furthermore, it is possible to form the conductive layer 3 without requiring heat treatment at a high temperature. Thus, even when a base material with a low heat resistance, such as one made from plastic, is used for the substrate 2, it is possible to prevent problems such as degradation of the base material.

Figure 1B:
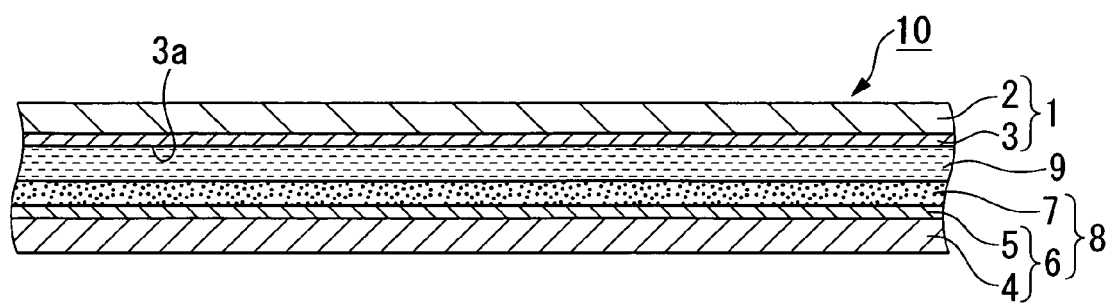
FIG. 1B is a cross-sectional views illustrating one example of a photoelectric conversion element according to the first exemplary embodiment of the present invention.

Next, a photoelectric conversion element according to the first exemplary embodiment of the present invention will be explained with reference to FIG. 1B. A photoelectric conversion element 10 shown in FIG. 1B is a dye-sensitized solar cell having the electrode 1 shown in FIG. 1A as a counter electrode. This dye-sensitized solar cell 10 includes a transparent electrode substrate 6, a working electrode 8 having an oxide semiconductive porous film 7 made of oxide semiconductive fine particles formed on the transparent electrode substrate 6, and a counter electrode 1 provided facing the working electrode 8. A sensitizing dye is provided on the oxide semiconductive porous film 7, and an electrolyte layer 9 containing a redox couple is disposed between the working electrode 8 and the counter electrode 1.

The transparent electrode substrate 6 used for the working electrode 8 may be prepared by forming a conductive layer 5 made of a glass plate, a plastic sheet, or the like, on a transparent base material 4 made of a conductive material. Having such a structure, the transparent electrode substrate 6 can function as a window through which light is introduced from outside.

The transparent base material 4 is preferably made of a material having excellent optical transparence properties when taking its function into consideration. Other than a glass plate, transparent plastic sheets made of polyethylene terephthalate (PET), polyethylene naphthalate (PEN), polycarbonate (PC), polyether sulfone (PES), or the like; a polished plate of a ceramic, such as titanium oxide, alumina, or the like, may be used.

For the conductive layer 5 in the working electrode 8, oxide semiconductors having excellent transparence properties, such as ITO, tin oxide ($SnO_2$), FTO, or the like can be used either alone or in a mixture of two or more thereof when taking the light transmittance of the transparent electrode substrate 6 into consideration. However, the material is not limited, and any suitable material having light transmittance and conductivity appropriate for use in the conductive layer 5 may be used. Furthermore, in order to improve the current collecting efficiency from the oxide semiconductive porous film 7 or the electrolyte layer 9, a metal wiring layer made of gold, silver, platinum, aluminum, nickel, titanium, or the like may be used in combination with the transparent conductive layer provided that an area ratio of the metal wiring layer is within the range that does not significantly degrade the light transmittance of the transparent electrode substrate 6. When such a metal wiring layer is used, the metal wiring layer preferably has a grid-like, stripe-like, or comb-like pattern so that light is transmitted through the transparent electrode substrate 6 as evenly as possible.

The method used to form the conductive layer 5 on the transparent base material 4 is not particularly limited, and examples thereof include any known thin film formation methods, such as sputtering methods, or CVD methods, spray decomposition methods (SPD), or evaporation methods when the conductive layer 5 is formed from a metal semiconductive material, such as ITO.

The oxide semiconductive porous film 7 is a porous thin layer containing as a main component oxide semiconductive fine particles that are made of titanium oxide ($TiO_2$), tin oxide ($SnO_2$), tungsten oxide ($WO_3$), zinc oxide (ZnO), and niobium oxide ($Nb_2O_5$), used either alone or in a combination of two or more materials, and have an average particle diameter of between 1 nm to 1000 nm.

The method for forming the oxide semiconductive porous film 7 is not particularly limited, and it can be formed, for example, by employing methods such as a method in which a dispersion solution that is obtained by dispersing commercially available oxide semiconductive fine particles in a desired dispersion medium, or a colloid solution that can be prepared using a sol-gel method is applied, after desired additives have been added thereto if these are required, using a known coating method such as a screen printing method, an inkjet printing method, a roll coating method, a doctor blade method, a spin coating method, a spray coating method, or the like. Other methods include: a migration electrodeposition method in which the transparent electrode substrate 6 is immersed in colloid solution and oxide semiconductive fine particles are made to adhere to the transparent electrode substrate 6 by electrophoresis; a method in which a foaming agent is mixed in a colloid solution or dispersion solution which is then coated and baked so as to form a porous material; and a method in which polymer microbeads are mixed together and applied, and these polymer microbeads are then removed by thermal treatment or chemical treatment, so as to define spaces and thereby form a porous material.

The dye that is provided in the oxide semiconductive porous film 7 is not particularly limited, and it is possible to use ruthenium complexes or iron complexes containing bipyridine structures, terpyridine structures, and the like in a ligand; metal complexes such as porphyrin and phthalocyanine; as well as organic dyes such as eosin, rhodamine, and melocyanine. The dye can be selected according to the application and the semiconductor that is used for the oxide semiconductive porous film 7.

For the electrolyte solution that is used for the electrolyte layer 9, it is possible to use an organic solvent or an ionic liquid (room temperature molten salt) that contains a redox pair. Furthermore, it is also possible to use what is known as a "gel electrolyte" which is quasi-solidified to reduce flowability and is obtained by adding a suitable gelling agent into the electrolyte solution. Furthermore, a polymer solid electrolyte or the like having electron transfer capability may be used.

Examples of the organic solvent include acetonitrile, methoxy acetonitrile, propionitrile, propylene carbonate, diethyl carbonate, and γ-butyrolacton.

Examples of the ionic liquid include salts made of cations, such as quaternary imidazolium based cations and anions, such as iodide ions or bistrifluoromethyl sulfonylimido anions, dicyanoamide anions, and the like.

As the gel-form electrolyte, an electrolyte composition containing an ionic liquid and metal oxide particles and/or conductive particles may be used, as described in Japanese Patent Application No. 2003-347193 of the present applicant, for example.

The metal oxide particles contained in the gel-form electrolyte may be one member or a mixture of two or members selected from the group consisting of $TiO_2$, $SnO_2$, $WO_3$, ZnO, ITO, $BaTiO_3$, $Nb_2O_5$, $In_2O_3$, $ZrO_2$, $Ta_2O_5$, $La_2O_3$, $SrTiO_3$, $Y_2O_3$, $Ho_2O_3$, $Bi_2O_3$, $CeO_2$, and $Al_2O_3$. The metal oxide may be an oxide doped with a dopant, or a composite oxide. The conductive particles may be particles including carbon as a main component, and a specific example includes carbon-cased particles, such as carbon nonotubes, carbon fibers, carbon black, carbon nanohorns, or the like.

The redox pair that is contained in the electrolyte layer 9 is not particularly limited. For example, pairs such as iodine/iodide ions, bromine/bromide ions, and the like may be added.

Additives, such as tert-butylpyridine and the like can be added if necessary to this electrolyte solution.

The method for forming the electrolyte layer 9 made of the electrolyte composition between the working electrode 8 and the counter electrode 1 is not particularly limited. Examples include, for example, a method in which the working electrode 8 and the counter electrode 1 are disposed facing each other and the electrolyte is supplied between the electrode 1 and 8 to form the electrolyte layer 9, or a method in which the electrolyte is dropped or applied on the counter electrode 1 or the working electrode 8 to form the electrolyte layer 9 and another electrode is stacked on the electrolyte layer 9. Furthermore, in order to prevent the leakage of the electrolyte from the space between the working electrode 8 and the counter electrode 1, it is preferable that the gap between the working electrode 8 and the counter electrode 1 be sealed using a film if necessary, or that the working electrode 8, the electrolyte layer 9, and the counter electrode 1 be contained in an appropriate casing.

As described above, since the photoelectric conversion element 10 of this example has the above-described electrode, the effective area (surface area) of the surface of the electrode is increased and excellent photoelectric conversion efficiency can be obtained without using platinum.

In a conventional dye-sensitized solar cell, although a surface area of a working electrode is increased by using an oxide semiconductive porous layer, the effective surface area is small since the surface of the counter electrode is made of a sputtered layer. For this reason, expensive platinum is typically used to obtain a satisfactory photoelectric conversion efficiency. In contrast, in the dye-sensitized solar cell of this example, since the electrode of the first embodiment of the present invention is used for the counter electrode 1, the effective area of the conductive layer 3 is large on the surface of the counter electrode 1 and photoelectric conversion efficiency that is comparable to a platinum electrode can be achieved without using expensive platinum.

EXAMPLES

Manufacturing of Electrode for Examples 1-1 to 1-8
Carbon particles and a conductive binder in a composition listed in Table 1 were dissolved and dispersed in a solvent. After the resultant liquid material was applied to a substrate using a doctor blade, the coated material was thoroughly dried, thereby obtaining an electrode to be used as a counter electrode.

A commercially available glass having an FTO film formed thereon or a PET film having an ITO film formed thereon was used as the substrate. Furthermore, soluble polyaniline, soluble polypyrrole, or poly (3,4-ethylene dioxythiophene) was used as the conductive binder. In Table 1, "PEDOT" represents poly (3,4-ethylene dioxythiophene).

Manufacturing of Electrode for Comparative Example 1-1

A platinum layer was formed above a glass having an FTO film formed thereon to a thickness of 1000 Å (=100 nm) by sputtering to form a glass having a platinum layer, which was used as the electrode. It should be noted that no conductive layer containing carbon particles and a binder was used in this example.

Manufacturing of Electrode for Comparative Examples 1-2 and 1-3

Carbon particles and an insulative binder in a composition listed in Table 1 were dissolved and dispersed in a solvent. After the resultant liquid material was applied to a substrate using a doctor blade, the coated material was thoroughly dried, thereby obtaining an electrode to be used as a counter electrode. A commercially available glass having an FTO film formed thereon was used as the substrate.

In Table 1, "PVdF-HFP" represents polyvinylidene fluoride-hexafluoropropylene copolymer.

Method for Evaluating Film Strength of Electrodes

The electrodes of Examples 1-1 to 1-8 and Comparative Examples 1-1 to 1-3 were visually inspected for possible peel-off of the conductive layer, and the results were evaluated using the following three ranks: A, B, and C, wherein "A" means that no peeling off of the conductive layer was observed, "B" means that slight peeling off was observed, and "C" means that considerable peeling off was observed.

Observation of Surface of Electrode

Figure 2:
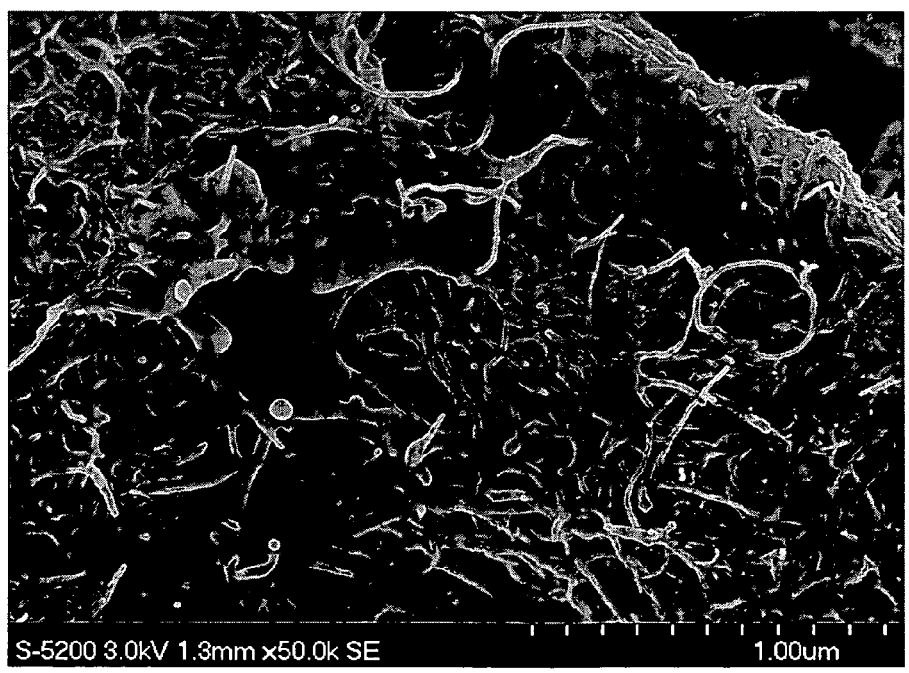
FIG. 2 is an electron micrograph of a surface of an electrode having a conductive layer containing carbon nanotubes and PEDOT.
Figure 3:
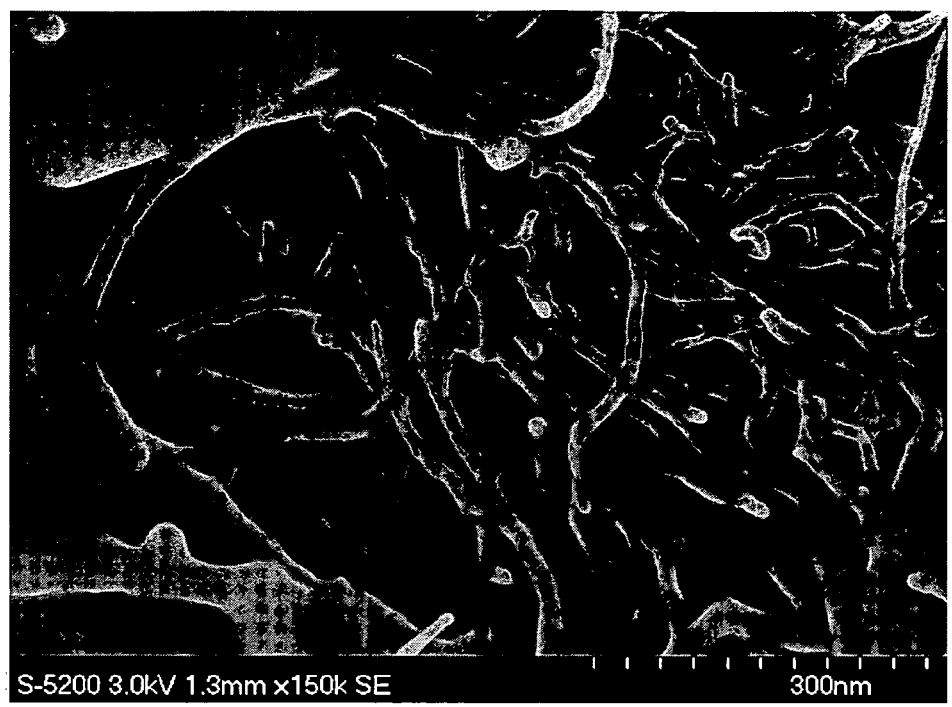
FIG. 3 is a magnified electron micrograph of the center portion of the electron micrograph shown in FIG. 2.
Figure 4:
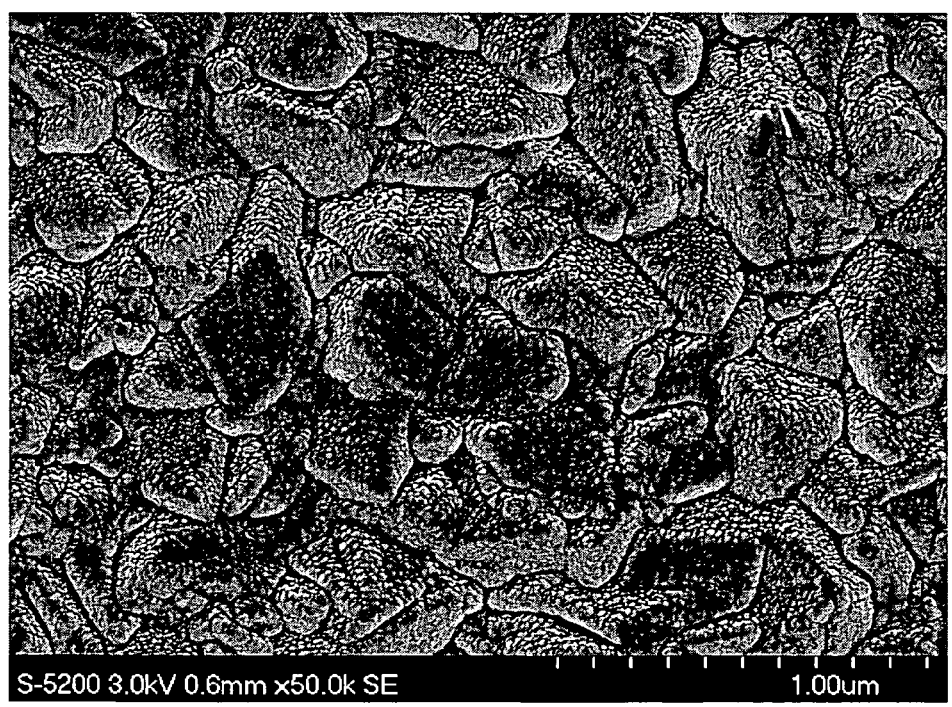
FIG. 4 is an electron micrograph of a surface of a glass and a platinum layer formed above the glass by sputtering, in which the glass has an FTO film formed thereon.

The surfaces of the electrodes of Examples 1-1 to 1-8 and Comparative Example 1-1 to 1-3 were observed using a field emission scanning electron microscope (FE-SEM). Electron micrographs of the surface of the electrode having conductive layer that was made of carbon nanotubes and PEDOT are shown in FIGS. 2 and 3. An electron micrograph of a surface of a glass and a platinum layer formed above the glass by sputtering, in which the glass has an FTO film formed thereon, is shown in FIG. 4

As shown in FIGS. 2 and 3 (FIG. 3 is a magnified picture of the center portion of the picture of FIG. 2), it was confirmed that a matrix of carbon nanotubes was bound by a binder polymer in a conductive layer in the case in which the carbon nanotubes were bound by the conductive polymer. In addition, numerous spaces extending from the surface of the conductive layer in the direction of the depth were formed, and the carbon nonotubes were exposed in a large area. At the portions bound by the binder polymer, the carbon nonotubes were covered by the binder polymer.

In this electrode, it is believed that since the binder polymer (PEDOT) is also conductive, both the portion in which the carbon nonotubes are exposed and the portion covered by the binder polymers on the surface of the electrode can function as effective areas that contribute to charge transfer, reaction, and the like.

In contrast, in the conductive layer in which the carbon nonotubes were bound by insulating polymer (e.g., PVdF-HFP), although similar spaces were formed, the effective area of the electrode was decreased since the bound portions did not contribute to the conductivity.

As shown in FIG. 4, in the case of a glass having a platinum layer on which the platinum layer was sputtered on the glass with an FTO film thereon, grain boundaries of the FTO grains having a size of several hundred nanometers were observed as net-like dark portions, as well as minute rises and falls of the surface of the platinum layer formed on the FTO film.

Manufacturing of Dye-Sensitized Photovoltaic Cell

Dye-sensitized photovoltaic cells having the electrodes of Examples 1-1 to 1-8 and Comparative Example 1-3 as counter electrodes were manufactured using the following procedures.

In the dye-sensitized solar cell 10 as shown in FIG. 1B, a slurry containing titanium oxide nanoparticles of an average particle size of between 13 nm to 20 nm applied to an FTO film (conductive layer 5) surface of a glass substrate having an FTO film (transparent electrode substrate 6) formed thereon, and dried, and then heated and baked at 450° C. for one hour to form an oxide semiconductive porous film 7. The transparent electrode substrate 6 having the oxide semiconductive porous film 7 formed thereon was then immersed overnight in a dye solution so as to be sensitized by the dye to form a working electrode. A ruthenium bipyridine complex (an N3 dye) was used as the dye.

An ionic liquid based electrolytic solution prepared as follows was used as the electrolytic solution. The electrolytic solution was prepared by using 1-hexyl-3-methylimidazolium iodide (HMIm-I) as the ionic liquid and adding appropriate amounts of lithium iodide, iodine, and 4-tert-butylpyridine to the ionic liquid.

The working electrode 8 was stacked on the counter electrode 1, and the electrolytic solution was supplied between the electrodes to form a dye-sensitized solar cell 10 that was a test cell.

Method for Measuring Opto-Electric Conversion Efficiency of Dye-Sensitized Photovoltaic Cell The photoelectric conversion characteristics of the cells were evaluated under light irradiating conditions of an AM (air mass) of 1.5 and an irradiance of 100 mW/cm$^2$.

Test Results

The evaluation results of the film strength of the electrode and the measurement results of the photoelectric conversion efficiency of the dye-sensitized photovoltaic cell are listed in Table 1.

TABLE 1

| | Substrate | Carbon Particles | Binder | Compounding Ratio (wt/wt) carbon/binder | Film Strength | Photoelectric Conversion Efficiency (%) |
|---|---|---|---|---|---|---|
| Example 1-1 | Glass/FTO film | MWCNT | Soluble polyaniline | 2:1 | A | 3.9 |
| Example 1-2 | Glass/FTO film | MWCNT | Soluble polypyrrole | 2:1 | A | 4.0 |

TABLE 1-continued

|  | Substrate | Carbon Particles | Binder | Compounding Ratio (wt/wt) carbon/binder | Film Strength | Photoelectric Conversion Efficiency (%) |
|---|---|---|---|---|---|---|
| Example 1-3 | Glass/FTO film | MWCNT | PEDOT | 2:1 | A | 4.8 |
| Example 1-4 | Glass/FTO film | MWCNT | PEDOT | 1:1 | A | 4.3 |
| Example 1-5 | Glass/FTO film | SWCNT | PEDOT | 2:1 | A | 4.5 |
| Example 1-6 | Glass/FTO film | C60 | PEDOT | 2:1 | A | 4.0 |
| Example 1-7 | Glass/FTO film | ketjen black | PEDOT | 2:1 | A | 4.2 |
| Example 1-8 | PET film/ITO film | MWCNT | PEDOT | 2:1 | A | 3.7 |
| Comparative Example 1-1 | Glass/Pt layer | — | — | — | — | 4.5 |
| Comparative Example 1-2 | Glass/FTO film | MWCNT | PVdF-HFP | 2:1 | A | 1.6 |
| Comparative Example 1-3 | Glass/FTO film | MWCNT | PVdF-HFP | 5:1 | B | 3.2 |

Each of the electrodes of Examples 1-1 to 1-8 exhibited characteristics comparative or even superior to those of the glass having a platinum layer. Furthermore, as indicated by Example 1-8, it is possible to obtain an excellent electrode and a dye-sensitized photovoltaic cell even when the first embodiment of the present invention is applied to a plastic substrate.

On the other hand, as indicated by Comparative Example 1-2, when carbon particles were bound using PVdF-HFP that is an insulative binder, the conductivity of the electrode was degraded since the electric connections between the carbon particles is inhibited by the insulating resin, resulting in a reduction in the photoelectric conversion efficiency. Furthermore, as indicated by Comparative Example 1-3, when the amount of the binder with respect to the amount of the carbon particles was reduced in order to improve the electric connection between the carbon particles in the case in which an insulative binder was used, a slight improvement in the photoelectric conversion efficiency was obtained although this was still inferior to those of the Examples. In addition, the coated film became unstable and was easily peeled off since the film strength of the conductive layer was degraded.

As described above, since the electrode according to the first embodiment of the present invention has a larger electrode surface area as well as higher conductivity, it was confirmed that it shows favorable photoelectric conversion characteristics when applied as a counter electrode of a dye-sensitized solar cell.

Second Exemplary Embodiment

Hereinafter, the present invention will be described based on a second exemplary embodiment thereof.

Figure 5A:
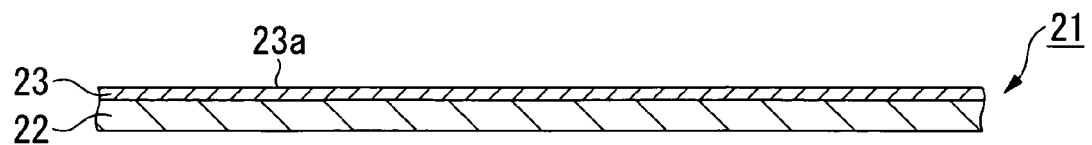
FIG. 5A is a cross-sectional view illustrating one example of an embodiment of an electrode according to a second exemplary embodiment of the present invention.

FIG. 5A is a cross-sectional view illustrating one example of an electrode according to a second exemplary embodiment of the present invention. An electrode (also referred to as an electrode substrate) 21 includes, for example, a substrate 22 and a conductive layer 23 that contains platinum particles and a conductive binder for binding the platinum particles provided on the substrate 22.

Examples of the substrate 22 include, but are not particularly limited to, a sheet or plate made of carbon, a glass, a plastic, a metal, a ceramic, or the like.

Glasses that may be used as the substrate 22 include, for example, borosilicate glass, quartz glass, soda glass, phosphate glass, and the like. Plastics that may be used as the substrate 22 include, for example, polyethylene terephthalate (PET), polyethylene naphthalate (PEN), polybutylene terephthalate (PBT), a polyimide, and the like. Metals that may be used as the substrate 22 include, for example, titanium, nickel, and the like.

The substrate 22 may be provided with a second conductive layer (not shown) made of a conductive metal oxide, such astin-doped indium oxide (ITO), fluorine-doped tin oxide (FTO), or FTO/ITO, or a metal formed on the surface above which the conductive layer 23 is to be provided. The material constituting the substrate and the second conductive layer is an exemplary material that is resistant to an electrolyte when in contact with the electrolyte. In the case in which an electrolyte containing iodine is used, copper and silver are not suitable, for example, since they are attacked by iodine and easily dissolve into the electrolyte.

The conductive layer 23 contains platinum particles and a conductive binder for binding the platinum particles, and spaces which communicate with a surface 3a of the conductive layer 3 are defined between the platinum particles.

The platinum particles of the present invention can be, but are not particularly limited to, nanoparticle-like ones from the viewpoint of film forming properties and surface area, and platinum particles having good conductivity are exemplary. As used herein, the term "nanoparticle-like" particles of the present invention means that the particles have a diameter in either main axis of 1000 nm or less. Fiber-like particles having a length more than 1000 nm in the longitudinal direction or spike-like particles having spikes having a length more than 1000 nm on the surface thereof can be regarded as nanoparticle-like particles of the present invention. Furthermore, platinum particles of spherical, polygonal, fiber-like, tree-needle-like, spike-like, flake-like, or porous particles, or the like, may be used either alone or in combination. Among them, tree-needle-like particles, spike-like particles, and porous particles having a large surface area are preferred.

In the conductive layer 23 of the electrode 21 of the present invention, platinum particles are bound by a conductive binder in order to form a film of the platinum particles above the substrate 22. The conductive binder is preferably one that requires no high temperature treatment and is easily applied to form a film, and a conductive polymer is preferred from the viewpoint of these properties. Examples of conductive polymers include, for example, polythiophenes, polyanilines, polypyrroles, and derivatives of these. A single conductive polymer may be used alone, or a combination of several conductive polymers may be used as a conductive binder.

As polythiophenes and derivatives thereof, a thiophene having unsubstituted hydrogen atoms on the thiophene ring, or thiophenes having, for example, one or more of substituent alkyl groups, halogen atoms, alkoxy groups, cyano groups or the like, may be used. Poly (3-alkylthiophene), poly (3,4-dialkyl thiophene), and poly (3,4-alkylene dioxythiophene), such as poly (3,4-ethylene dioxythiophene) (PEDOT), are exemplary.

As polypyrroles and derivatives thereof, polypyrroles with unsubstituted hydrogen atoms on the pyrrole ring, or polypyrroles having, for example, one or more of substituent alkyl groups, halogen atoms, alkoxy groups, cyano groups or the like may be used. Poly (3-alkyl pyrrole), poly (3,4-dialkyl pyrrole), and poly (3,4-alkylene dioxypyrrole), or the like are exemplary.

As polyanilines and derivatives thereof, polyanilines, poly (N-alkyl aniline), poly (arylamine), poly (phenylenediamine), and poly (aminopyrene), or the like are exemplary.

When the conductive layer 23 in which the platinum particles are bound by the conductive binder is formed above the substrate 22, spaces are formed in which no conductive binder is present between platinum particles. In this case, the spaces are cavities that communicate with the surface 23a of the conductive layer 23, and the spaces define paths through which an electrolyte (an electrolytic solution or the like) infiltrates. Thus, in the electrode of this example, the electrolyte infiltrates inside the spaces, and the entire inner surfaces of the spaces can function as an effective area that contributes to charge transfer, reaction, and the like.

Especially, nanoparticles are exemplary since they have a large apparent volume per weight and the spaces are effectively formed.

In addition, since a film of the platinum particles is formed using the conductive binder, it is possible to form the conductive layer 23 without requiring heat treatment at high temperature, allowing formation of the film on a base material with low heat resistance, such as one made of plastic.

When nanoparticles that have a large apparent volume per weight are used, a relatively large amount of binder is required in order to improve the film formation properties and the film strength. For this reason, when an insulating resin, such as polyester, polyurethane, polyvinylidene fluoride (PVdF), polyvinylidene fluoride-hexafluoropropylene copolymer (PVdF-HFP), or the like is used as a binder, the binder inhibits the particles from coming into contact with each other, which may reduce the conductivity of the electrode 21. The amount to be added and the mixed state of the binder may be difficult to control. In contrast, the use of a binder that exhibits conductivity is advantageous in that decrease in the conductivity due to presence of the binder between particles is prevented and increase in the internal resistance is suppressed. In addition, constraints in terms of the composition and the mixing method of the conductive layer 23 are few.

The compounding ratio of the platinum particles to the conductive binder is appropriately selected according to types of platinum particles and conductive binder used. If too many platinum particles are present with respect to the amount of the conductive binder, the platinum particles may not be bound and a film may not be formed. Thus, the conductive binder is added at a compounding ratio such that the platinum particles are favorably bound to each other. If the amount of the platinum particles is too small with respect to the amount of the conductive binder, the platinum particles may be buried in the conductive binder and no spaces may be formed. Thus, the conductive binder is added at a compounding ratio such that spaces are formed.

The method for forming the electrode 21 of the present invention is not particularly limited, but the conductive layer 23 may be formed by dispersing or dissolving the platinum particles and the conductive binder into a solvent, applying the resulting mixture onto the substrate 22, and drying it, for example.

Examples of the solvent include, but not particularly limited to, tetrahydrofuran, ethyl methyl ketone, dimethylformamide, acetonitrile, methoxy acetonitrile, propionitrile, propylene carbonate, a diethyl carbonate, methanol, γ-butyrolactone, and N-methylpyrrolidone.

It is desired that the platinum particles and the conductive binder be dispersed or dissolved in the solvent as evenly as possible, and the selection of the solvent is preferably made by taking the dispersibility and the solubility of the platinum particles and the conductive binder into consideration. It is desirable that the conductive binder have sufficient solubility or dispersibility with respect to the solvent.

The method for applying the mixture is not particularly limited, and various coating methods may be applicable, such as the doctor blade method, the spin coating method, the dipping method, the printing method, and the like.

Furthermore, two or more layers of the conductive layer 23 may be laminated by repeating steps of the coating and drying of the mixture several times. With the present invention, the effective area can be increased by laminating a plurality of conductive layers 23 to increase the film thickness since the spaces may communicate between the layers.

In contrast, when a platinum layer is formed using a vacuum film formation method, for example, the effect of increasing the effective area cannot be obtained by laminating a plurality of layers because only the surface area of the outermost layer is available as the effective area.

According to the electrode of this example, it is possible to manufacture an electrode exhibiting stable properties with simplified steps at low cost. Furthermore, by binding the platinum particles using the conductive binder, it is possible to form a conductive layer 23 with a porous structure having spaces on the surface 23a thereof, thereby increasing the effective area (surface area) of the electrode 21. Furthermore, it is possible to form a conductive layer 23 without requiring heat treatment at a high temperature. Thus, even when a base material with low heat resistance, such as one made from plastic, is used for the substrate 22, it is possible to prevent problems such as degradation of the base material. By using a plastic substrate as the substrate 22, it is possible to manufacture lightweight electrodes or flexible electrodes, which can be employed in various applications.

Figure 5B:
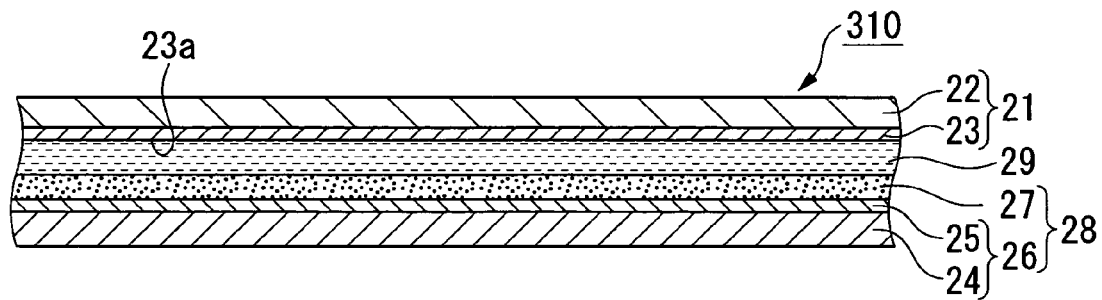
FIG. 5B is a cross-sectional views illustrating one example of a photoelectric conversion element according to the second exemplary embodiment of the present invention.

Next, a photoelectric conversion element according to the first preferred embodiment of the present invention will be explained with reference to FIG. 5B. A photoelectric conversion element 30 shown in FIG. 5B is a dye-sensitized solar cell having the electrode 21 shown in FIG. 5A as a counter electrode. This dye-sensitized solar cell 30 includes a transparent electrode substrate 26, a working electrode 28 having an oxide semiconductive porous film 27 made of oxide semiconductive fine particles formed on the transparent electrode substrate 26, and a counter electrode 21 provided facing the working electrode 28. A sensitizing dye is provided on the oxide semiconductive porous film 27, and an electrolyte layer 29 containing a redox couple is disposed between the working electrode 28 and the counter electrode 21.

The transparent electrode substrate 26 used for the working electrode 28 may be prepared by forming a conductive layer 25 made of a glass plate, a plastic sheet, or the like, on a transparent base material 24 made of a conductive material. Having such a structure, the transparent electrode substrate 26 can function as a window through which light is introduced from outside.

The transparent base material 24 is preferably made of a material having excellent optical transparence properties when taking its function into consideration. Other than a glass plate, transparent plastic sheets made of polyethylene terephthalate (PET), polyethylene naphthalate (PEN), polycarbonate (PC), polyether sulfone (PES), or the like; a polished plate of a ceramic, such as titanium oxide, alumina, or the like, may be used.

For the conductive layer 25 in the working electrode 28, it is preferable that oxide semiconductors having excellent transparence properties, such as ITO, tin oxide ($SnO_2$), FTO, or the like be used either alone or in a mixture of two or more thereof when taking the light transmittance of the transparent electrode substrate 26 into consideration. However, the material is not limited, and any suitable material having light transmittance and conductivity appropriate for use in the conductive layer 5 may be used. Furthermore, in order to improve the current collecting efficiency from the oxide semiconductive porous film 27 or the electrolyte layer 29, a metal wiring layer made of gold, silver, platinum, aluminum, nickel, titanium, or the like may be used in combination with the transparent conductive layer provided that an area ratio of the metal wiring layer is within the range that does not significantly degrade the light transmittance of the transparent electrode substrate 26. When such a metal wiring layer is used, the metal wiring layer preferably has a grid-like, stripe-like, or comb-like pattern so that light is transmitted through the transparent electrode substrate 26 as evenly as possible.

The method used to form the conductive layer 25 on the transparent base material 24 is not particularly limited, and examples thereof include any known thin film formation methods, such as sputtering methods, or CVD methods, spray decomposition methods (SPD), or evaporation methods when the conductive layer 25 is formed from a metal semiconductive material, such as ITO.

The oxide semiconductive porous film 27 is a porous thin layer containing as a main component oxide semiconductive fine particles that are made of titanium oxide ($TiO_2$), tin oxide ($SnO_2$), tungsten oxide ($WO_3$), zinc oxide (ZnO), and niobium oxide ($Nb_2O_5$), used either alone or in a combination of two or more materials, and have an average particle diameter of between 1 nm to 1000 nm.

The method for forming the oxide semiconductive porous film 27 is not particularly limited and it can be formed, for example, by employing methods such as a method in which a dispersion solution that is obtained by dispersing commercially available oxide semiconductive fine particles in a desired dispersion medium, or a colloid solution that can be prepared using a sol-gel method is applied, after desired additives have been added thereto if these are required, using a known coating method such as a screen printing method, an inkjet printing method, a roll coating method, a doctor blade method, a spin coating method, a spray coating method, or the like. Other methods include: a migration electrodeposition method in which the transparent electrode substrate 26 is immersed in colloid solution and oxide semiconductive fine particles are made to adhere to the transparent electrode substrate 26 by electrophoresis; a method in which a foaming agent is mixed in a colloid solution or dispersion solution which is then coated and baked so as to form a porous material; and a method in which polymer microbeads are mixed together and applied, and these polymer microbeads are then removed by thermal treatment or chemical treatment, so as to define spaces and thereby form a porous material.

The dye that is provided in the oxide semiconductive porous film 27 is not particularly limited, and it is possible to use ruthenium complexes or iron complexes containing bipyridine structures, terpyridine structures, and the like in a ligand; metal complexes such as porphyrin and phthalocyanine; as well as organic dyes such as eosin, rhodamine, and melocyanine. The dye can be selected according to the application and the semiconductor that is used for the oxide semiconductive porous film 27.

For the electrolyte solution that is used for the electrolyte layer 29, it is possible to use an organic solvent or an ionic liquid (room temperature molten salt) that contains a redox pair. Furthermore, it is also possible to use what is known as a "gel electrolyte" which is quasi-solidified to reduce flowability and is obtained by adding a suitable gelling agent into the electrolyte solution. Furthermore, a polymer solid electrolyte or the like having electron transfer capability may be used.

Examples of the organic solvent include acetonitrile, methoxy acetonitrile, propionitrile, propylene carbonate, diethyl carbonate, and γ-butyrolacton.

Examples of the ionic liquid include salts made of cations, such as quaternary imidazolium based cations and anions, such as iodide ions or bistrifluoromethyl sulfonylimido anions, dicyanoamide anions, and the like.

As the gel-form electrolyte, an electrolyte composition containing an ionic liquid and metal oxide particles and/or conductive particles may be used, as described in Japanese Patent Application No. 2003-347193 of the present applicant, for example.

The metal oxide particles contained in the gel-form electrolyte may be one member or a mixture of two or members selected from the group consisting of $TiO_2$, $SnO_2$, $WO_3$, ZnO, ITO, $BaTiO_3$, $Nb_2O_5$, $In_2O_3$, $ZrO_2$, $Ta_2O_5$, $La_2O_3$, $SrTiO_3$, $Y_2O_3$, $Ho_2O_3$, $Bi_2O_3$, $CeO_2$, and $Al_2O_3$. The metal oxide may be an oxide doped with a dopant, or a composite oxide. The conductive particles may be particles including carbon as a main component, and a specific example includes carbon-cased particles, such as carbon nanotubes, carbon fibers, carbon black, carbon nanohorns, or the like.

The redox pair that is contained in the electrolyte layer 29 is not particularly limited. For example, pairs such as iodine/iodide ions, bromine/bromide ions, and the like may be added. For the supply source of iodide ions or the bromide ions, lithium salt, quaternary imidazolium salt, tetrabutylammonium salt, and the like of the above-described halogen salts may be used alone or in a combination.

Additives, such as tert-butylpyridine and the like can be added if necessary to this electrolyte solution.

The method for forming the electrolyte layer 29 made of the electrolyte composition between the working electrode 28 and the counter electrode 21 is not particularly limited. Examples include, for example, a method in which the working electrode 28 and the counter electrode 21 are disposed facing each other and the electrolyte is supplied between the electrode 21 and 28 to form the electrolyte layer 29, or a method in which the electrolyte is dropped or applied on the counter electrode 21 or the working electrode 28 to form the electrolyte layer 29 and another electrode is stacked on the electrolyte layer 29. Furthermore, in order to prevent the leakage of the electrolyte from the space between the working electrode 28 and the counter electrode 21, it is preferable that the gap between the working electrode 28 and the counter electrode 21 be sealed using a film if necessary, or that the working electrode 28, the electrolyte layer 29, and the counter electrode 21 be contained in an appropriate casing.

In a conventional dye-sensitized solar cell, although a surface area of a working electrode is increased by using an oxide semiconductive porous layer, the effective surface area is small since the surface of the counter electrode is made of a sputtered layer. In contrast, since the photoelectric conversion element 30 of this example has the above-described electrode, the effective area (surface area) of the surface of the electrode is increased. Accordingly, the photoelectric conversion element 30 of this example can achieve photoelectric conversion efficiency that is comparable to or even superior to ones having a sputtered platinum film as an electrode.

Manufacturing of Electrode for Examples 2-1 to 2-5

Platinum particles and a conductive binder in a composition listed in Table 2 were dissolved and dispersed in a solvent. After the resultant liquid material was applied to a substrate using a doctor blade, the coated material was thoroughly dried, thereby obtaining an electrode to be used as a counter electrode.

A commercially available glass having an FTO film formed thereon or a PET film having an ITO film formed thereon was used as the substrate. Furthermore, soluble polyaniline or poly (3,4-ethylene dioxythiophene) was used as the conductive binder. In Table 2, "PEDOT" represents poly (3,4-ethylene dioxythiophene).

Manufacturing of Electrode for Comparative Example 2-1

A platinum layer was formed above a glass having an FTO film formed thereon to a thickness of 1000 Å (=100 nm) by sputtering to form a glass having a platinum layer, which was used as the electrode. It should be noted that no conductive layer containing platinum particles and a binder was used in this example.

Manufacturing of Electrode for Comparative Example 2-2

Platinum particles as shown in Table 2 were dissolved and dispersed in a solvent. After the resultant mixture was applied to a substrate using a doctor blade, the coated material was thoroughly dried, thereby obtaining an electrode to be used as a counter electrode. A commercially available glass having an FTO film formed thereon was used as the substrate.

Manufacturing of Electrode for Comparative Example 2-3

Platinum particles and an insulative binder in a composition listed in Table 2 was dissolved and dispersed in a solvent. After the resultant liquid material was applied to a substrate using a doctor blade, the coated material was thoroughly dried, thereby obtaining an electrode to be used as a counter electrode. A commercially available glass having an FTO film formed thereon was used as the substrate.

In Table 2, "PVdF-HFP" represents polyvinylidene fluoride-hexafluoropropylene copolymer.

Method for Evaluating Film Strength of Electrodes

The electrodes of Examples 2-1 to 2-5 and Comparative Examples 2-1 to 2-3 were visually inspected for possible peel-off of the conductive layer, and the results were evaluated using the following three ranks: A, B, and C, wherein "A" means that no peeling off of the conductive layer was observed, "B" means that slight peeling off was observed, and "C" means that considerable peeling off was observed.

Observation of Surface of Electrode

The surfaces of the electrodes of Examples 2-1 to 2-5 and Comparative Example 2-3 were observed using a field emission scanning electron microscope (FE-SEM). It was confirmed that platinum particles were bound by a binder polymer. In addition, numerous spaces extending from the surface of the conductive layer in the direction of the depth were formed, and the platinum particles were exposed in a large area. At the portions bound by the binder polymer, the platinum particles were covered by the binder polymer.

In these electrodes of Examples 2-1 to 2-5, it is believed that since the binder polymer (PEDOT) is also conductive, both the portion in which the platinum particles are exposed and the portion covered by the binder polymers on the surface of the electrode can function as effective areas that contribute to charge transfer, reaction, and the like.

In contrast, in the electrode of Comparative Example 2-3, it is believed that since the binder polymer (PVdF-HFP) has an insulating property, the portion covered by the binder polymers does not contribute to charge transfer, or reaction, resulting in the reduced effective area of the surface of the electrode.

Manufacturing of Dye-Sensitized Photovoltaic Cell

Dye-sensitized photovoltaic cells having the electrodes of Examples 2-1 to 2-5 and Comparative Examples 2-1 to 2-3 as counter electrodes were manufactured using the following procedures.

In the dye-sensitized solar cell 30 as shown in FIG. 5, a slurry containing titanium oxide nanoparticles of an average particle size of between 13 nm to 20 nm applied to an FTO film (conductive layer 25) surface of a glass substrate having an FTO film (transparent electrode substrate 26) formed thereon, and dried, and then heated and baked at 450° C. for one hour to form an oxide semiconductive porous film 27. The transparent electrode substrate 26 having the oxide semiconductive porous film 27 formed thereon was then immersed overnight in a dye solution so as to be sensitized by the dye to form a working electrode. A ruthenium bipyridine complex (an N3 dye) was used as the dye.

An ionic liquid based electrolytic solution prepared as follows was used as the electrolytic solution. The electrolytic solution was prepared by using 1-hexyl-3-methylimidazolium iodide (HMIm-I) as the ionic liquid and adding appropriate amounts of lithium iodide, iodine, and 4-tert-butylpyridine to the ionic liquid.

The working electrode 28 was stacked on the counter electrode 21, and the electrolytic solution was supplied between the electrodes to form a dye-sensitized solar cell 30 that was a test cell.

Method for Measuring Photoelectric Conversion Efficiency of Dye-Sensitized Photovoltaic Cell The photoelectric conversion characteristics of the cells were evaluated under light irradiating conditions of an AM (air mass) of 1.5 and an irradiance of 100 mW/cm$^2$.

Test Results

The evaluation results of the film strength of the electrode and the measurement results of the photoelectric conversion efficiency of the dye-sensitized photovoltaic cell are listed in Table 2.

TABLE 2

| | Substrate | Platinum particles | Binder | Compounding Ratio (wt/wt) platinum/binder | Film Strength | Photoelectric Conversion Efficiency (%) |
|---|---|---|---|---|---|---|
| Example 2-1 | Glass/FTO film | Horn-like grain diameter of about 9 nm | PEDOT | 9:1 | A | 4.3 |
| Example 2-2 | Glass/FTO film | Tree-needle-like grain diameter of about 120 nm | PEDOT | 9:1 | A | 4.9 |
| Example 2-3 | Glass/FTO film | Tree-needle-like grain diameter of about 120 nm | PEDOT | 4:1 | A | 4.5 |
| Example 2-4 | Glass/FTO film | Tree-needle-like grain diameter of about 120 nm | Soluble polypyrrole | 9:1 | A | 4.5 |
| Example 2-5 | PET/ITO film | Tree-needle-like grain diameter of about 120 nm | PEDOT | 9:1 | A | 3.9 |
| Comparative Example 2-1 | PET/ITO film | Sputtered platinum layer | — | | | 4.5 |
| Comparative Example 2-2 | Glass/FTO film | Tree-needle-like grain diameter of about 120 nm | — | | C | Measurement not possible |
| Comparative Example 2-3 | Glass/FTO film | Tree-needle-like grain diameter of about 120 nm | PVdF-HFP | 4:1 | A | 0.9 |

Each of the electrodes of Examples 2-1 to 2-5 exhibited characteristics comparative or even superior to those of the glass having a platinum layer. Furthermore, as indicated by Example 2-5, it is possible to obtain an excellent electrode and a dye-sensitized photovoltaic cell even when the second embodiment of the present invention is applied to a plastic substrate.

On the other hand, as indicated by Comparative Example 2-3, when platinum particles were bound using PVdF-HFP that is an insulative binder, the conductivity of the electrode was degraded since the electric connections between the platinum particles is inhibited by the insulating resin, resulting in a reduction in the photoelectric conversion efficiency.

As indicated by Comparative Example 2-2, when platinum particles were dispersed into the solvent without using a binder and the solution was coated on the substrate for forming the film, the platinum particles were not fixed on the substrate and the film easily peeled off. As a result, it was impossible to manufacture a dye-sensitized photovoltaic cell in Comparative Example 2-2.

As described above, since the electrode according to the second embodiment of the present invention has a larger electrode surface area as well as higher conductivity, it was confirmed that it shows favorable photoelectric conversion characteristics when applied as a counter electrode of a dye-sensitized solar cell.

The electrode of the present invention is suited to be used as an electrode for photoelectric conversion elements, such as dye-sensitized solar cells, for example. In addition, the electrode is expected to be useful for use in various elements having electric or electrochemical action.

While exemplary embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An electrode comprising:
   a substrate; and
   a conductive layer containing carbon particles and a conductive binder for binding the carbon particles formed above the substrate,
   wherein spaces that communicate with a surface of the conductive layer are defined between the carbon particles,
   and the mass ratio of the carbon particles to the conductive binder is from 0.5 to 5.

2. The electrode according to claim 1, wherein the carbon particles contain nanoparticle-like carbon particles as a main component.

3. The electrode according to claim 1, wherein the conductive binder contains a conductive polymer as a main component.

4. The electrode according to claim 3, wherein the conductive polymer is poly (3,4-ethylene dioxythiophene) or a derivative thereof.

5. The electrode according to claim 3, wherein the conductive polymer is at least one selected from the group consisting of a polythiophene, polyaniline, polypyrrole, and derivatives thereof.

6. The electrode according to claim 1, wherein said substrate is formed of a material selected from the group consisting of glass, plastic, metal and ceramic.

7. The electrode according to claim 6, wherein said substrate is formed of plastic.

8. The electrode according to claim 1, further comprising a second conductive layer formed between the substrate and the conductive layer.

9. The electrode according to claim 8, wherein said second conductive layer comprises conductive metal oxide.

10. The electrode according to claim 1, wherein the mass ratio of the carbon particles to the conductive binder is from 1:1 to 1:2.

11. A photoelectric conversion element, comprising:
    an electrode comprising a substrate, and a conductive layer containing carbon particles and a conductive binder for binding the carbon particles formed above the substrate, wherein spaces that communicate with a surface of the conductive layer are defined between the carbon particles, and the mass ratio of the carbon particles to the conductive binder is from 0.5 to 5.

12. The photoelectric conversion element according to claim 11, further comprising:
    a working electrode having a transparent electrode substrate and a semiconductive porous film which is provided on the transparent electrode substrate; and an electrolyte layer disposed between the working electrode and the electrode, wherein the transparent electrode substrate comprises a transparent base material and a metal wiring layer provided on the transparent base material, and the metal wiring layer has a pattern selected from the group consisting of a grid-like, stripe-like, or comb-like pattern.

13. The photoelectric conversion element according to claim 11, wherein the mass ratio of the carbon particles to the conductive binder is from 1:1 to 1:2.

14. A dye-sensitized photovoltaic cell, comprising:

an electrode comprising a substrate, and a conductive layer containing carbon particles and a conductive binder for binding the carbon particles formed above the substrate, wherein spaces that communicate with a surface of the conductive layer are defined between the carbon particles, and the mass ratio of the carbon particles to the conductive binder is from 0.5 to 5.

15. The dye-sensitized photovoltaic cell according to claim 14, wherein the mass ratio of the carbon particles to the conductive binder is from 1:1 to 1:2.

16. An electrode comprising:

a substrate; and a conductive layer containing platinum particles and a conductive binder for binding the platinum particles formed above the substrate, wherein spaces that communicate with a surface of the conductive layer are defined between the platinum particles, and the mass ratio of the platinum particles to the conductive binder is from about 4:1 to about 9:1.

17. The electrode according to claim 16, wherein the platinum particles contain nanoparticle-like platinum particles as a main component.

18. The electrode according to claim 16, wherein the conductive binder contains a conductive polymer as a main component.

19. The electrode according to claim 18, wherein the conductive polymer is poly (3,4-ethylene dioxythiophene) or a derivative thereof.

20. A photoelectric conversion element, comprising:

an electrode comprising a substrate, and a conductive layer containing platinum particles and a conductive binder for binding the platinum particles formed above the substrate, wherein spaces that communicate with a surface of the conductive layer are defined between the platinum particles, and the mass ratio of the platinum particles to the conductive binder is from about 4:1 to about 9:1.

21. A dye-sensitized photovoltaic cell, comprising:

an electrode comprising a substrate, and a conductive layer containing platinum particles and a conductive binder for binding the platinum particles formed above the substrate, wherein spaces that communicate with a surface of the conductive layer are defined between the platinum particles, and the mass ratio of the platinum particles to the conductive binder is from about 4:1 to about 9:1.

* * * * *